United States Patent
Hathaway et al.

(10) Patent No.: US 6,225,696 B1
(45) Date of Patent: May 1, 2001

(54) ADVANCED RF ELECTRONICS PACKAGE

(75) Inventors: James A. Hathaway; David J. Brunone, both of Rancho Palos Verdes; Michelle M. Reyes, Huntington Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/057,041

(22) Filed: Apr. 8, 1998

Related U.S. Application Data

(62) Division of application No. 08/932,474, filed on Sep. 18, 1997.

(51) Int. Cl.⁷ .................................................. H01L 23/34
(52) U.S. Cl. ......................... 257/728; 257/703; 257/704; 257/724
(58) Field of Search ................... 257/678, 700, 257/703, 704, 705, 724, 728, 729, 701, 723; 29/841, 855; 174/52.2, 256; 361/761, 765, 321.1, 600, 783

(56) References Cited

U.S. PATENT DOCUMENTS

| | | | |
|---|---|---|---|
| 2,903,627 | 12/1959 | McGarvey | 317/101 |
| 3,401,309 | 9/1968 | Shatz | 3/101 |
| 4,487,999 | 12/1984 | Phillips et al. | 174/52 |
| 4,547,836 | 10/1985 | Anthony | 361/400 |
| 4,647,476 | 3/1987 | Anthony | 427/97 |
| 4,732,780 | 3/1988 | Mitoff et al. | 427/125 |

(List continued on next page.)

FOREIGN PATENT DOCUMENTS

| | | | |
|---|---|---|---|
| 001890 | * | 10/1978 | (EP) . |
| 157505 | * | 3/1985 | (EP) . |
| 198698 | * | 4/1986 | (EP) . |
| 440820 | * | 2/1991 | (EP) . |

OTHER PUBLICATIONS

D.S. Wein, *Advanced Ceramic Packaging for Microwave and Millimeter Wave Applications*, IEEE Transactions on Antennas and Propagation, vol. 43, No. 9, Sep. 1, 1995, pp. 940–948.

*Primary Examiner*—Olik Chaudhuri
*Assistant Examiner*—Alonzo Chambliss
(74) *Attorney, Agent, or Firm*—Michael S. Yatsko

(57) ABSTRACT

An advanced electronics package for integrating electronic components of an electronic circuit, such as RF circuits. An important aspect of the invention relates to the simplicity in forming and integrating the electronic components in the package relative to known electronics packages. In one embodiment of the invention, various ceramic preforms are utilized which may be cast with temperature durable electronic components or formed as interconnect channels or feedthroughs. The preforms, in turn, are adapted to be cast into a composite housing, for example, an aluminum silicon carbide (AlSiC) housing. The component preforms may include resistors, capacitors, and inductors. In addition, RF pins as well as DC pads may be cast in the housing. The electronic components are electrically coupled to an interconnect channel or feedthrough. Interconnections by way of the interconnect channels or feedthroughs within the package may be made by way of metal infusion of a metal, such as aluminum, into the ceramic of the interconnect channels. In an alternate embodiment of the invention, a polymer based integrated package, formed from a polymer, is molded around a cast base which acts as a heat sink. Interconnection between the various electronic components is made by either molding interconnect metal tracings in the polymer housing or by way of interconnection vias which are filled with polymer based conductive paste or immersion plating. In both embodiments, interconnections between electronic components forming the electronic circuit are made without the use of glass feedthroughs which greatly simplifies the cost and complexity of the package.

13 Claims, 3 Drawing Sheets

U.S. PATENT DOCUMENTS

| | | | |
|---|---|---|---|
| 4,841,101 | 6/1989 | Pollock | 174/152 |
| 4,890,663 | 1/1990 | Yarahmadi | 164/98 |
| 4,899,118 | 2/1990 | Polinski, Sr. | 333/246 |
| 4,915,719 | 4/1990 | Saffari et al. | 65/32.2 |
| 4,996,588 * | 2/1991 | Malibe et al. . | |
| 5,055,966 | 10/1991 | Smith et al. | 361/321 |
| 5,114,881 * | 5/1992 | Kaneko et al. . | |
| 5,136,271 * | 8/1992 | Nishioka et al. | 333/246 |
| 5,138,436 | 8/1992 | Koepf | 257/728 |
| 5,148,135 | 9/1992 | Stein | 333/246 |
| 5,163,499 | 11/1992 | Newkirk et al. | 164/98 |
| 5,170,142 | 12/1992 | Bier | 333/245 |
| 5,175,067 | 12/1992 | Taylor et al. | 429/181 |
| 5,185,654 | 2/1993 | Mosher et al. | 257/659 |
| 5,214,498 * | 5/1993 | Lehman et al. | 257/678 |
| 5,259,436 | 11/1993 | Yun et al. | 257/728 |
| 5,311,920 | 5/1994 | Cook | 164/97 |
| 5,347,258 | 9/1994 | Howard et al. | 338/333 |
| 5,365,108 | 11/1994 | Anderson et al. | 257/678 |
| 5,376,909 | 12/1994 | Nelson et al. | 333/247 |
| 5,384,434 | 1/1995 | Mandai et al. | 174/258 |
| 5,387,888 * | 2/1995 | Eda et al. . | |
| 5,394,930 * | 3/1995 | Kennerknecht . | |
| 5,422,615 | 6/1995 | Shibagaki et al. | 333/246 |
| 5,448,826 | 9/1995 | Goetz et al. | 29/848 |
| 5,455,118 | 10/1995 | Cook | 428/555 |
| 5,526,867 | 6/1996 | Keck et al. | 164/97 |
| 5,528,076 | 6/1996 | Pavlo | 257/666 |
| 5,532,513 * | 7/1996 | Smith et al. | 257/703 |
| 5,602,421 | 2/1997 | Li | 257/728 |
| 5,653,834 | 8/1997 | Azzaro et al. | 427/97 |

* cited by examiner

ADVANCED RF ELECTRONICS PACKAGE

"This is a divisional application of U.S. patent application Ser. No. 08/932,474, filed Sep. 18, 1997."

BACKGROUND OF THE INVENTION

1. Field of the Invention

The present invention relates to an integrated electronics package for integrating various electronic components that form an electronic circuit, such as an RF circuit, which is relatively simple to form and thus less expensive than known electronic packages and eliminates the need for glass feedthroughs for interconnections.

2. Description of the Prior Art

Various electronic packaging systems and methods for forming integrated packages for electronic circuits, such as RF circuits, are known in the art. Examples of such an electronic packaging systems and methods are disclosed in U.S. Pat. Nos. 2,903,627; 3,401,309; 5,138,436; 5,148,135; 5,365,108; 5,376,909; 5,422,615; 5,526,867 and 5,602,141. In such electronic packaging systems, the various electronic components forming the electronic circuit are interconnected and housed to form an integrated assembly. The electronic components which form the circuit may be discrete components, integrated circuits as well as microwave monolithic integrated circuits (MMIC). Electronic packaging systems for interconnecting and integrating such components are known. For example, U.S. Pat. No. 2,903,607 discloses an electronics package for integrating discrete electronic components. U.S. Pat. No. 3,401,309 discloses an electronics package for integrating various electronic components including integrated circuits while U.S. Pat. No. 5,138,426 discloses an electronics package for integrating various electronic components including MMIC's.

In many known applications of electronic packaging systems, various electronic components including IC's and MMIC's which form part of an electronic circuit of interest are known to be carried by single or multiple layer substrates or printed circuit boards. In such applications, in order to provide a connection from one layer of the substrate or printed circuit board to the other or to components on different sides of the substrate or printed circuit board, glass feedthroughs are known for interconnecting the circuitry in such configurations. The glass feedthroughs essentially include a via or hole filled with a glass insulator which surrounds an electrical conductor. Examples of such glass feedthroughs are disclosed in U.S. Pat. Nos. 4,915,719 and 5,653,834. The process for forming the glass feedthroughs can be relatively complicated, for example as set forth in U.S. Pat. No. 5,653,834. As such, electronic packages which utilize such glass feedthroughs are relatively expensive to fabricate. In addition, there are other known problems associated with such glass feedthroughs. In particular, such glass feedthroughs are known to leak or become damaged during testing and use.

Other known electronic packaging systems require multiple steps to fabricate. For example, as disclosed in U.S. Pat. No. 5,602,421 discloses an electronics package in which two ceramic layers are sandwiched between two metal layers. While such an electronic package may be suitable as an electronic package. the multiple steps and layers of the package generally increase the cost and complexity of the electronics package.

SUMMARY OF THE INVENTION

It is an object of the present invention to solve various problems in the prior art.

It is yet another object of the present invention to provide an electronics package for integrating various electronic components including IC's and MMIC's which obviates the need for glass feedthroughs.

It is yet another object of the present invention to provide an electronics package for integrating various electronic components in an electronic circuit which is relatively simple to fabricate relative to known electronics packages.

The present invention relates to an advanced electronics package for integrating electronic components of an electronic circuit, such as RF circuits. An important aspect of the invention relates to the simplicity in forming and integrating the electronic components in the package relative to known electronics packages. In one embodiment of the invention, various ceramic preforms are utilized which may be cast with temperature durable electronic components or formed as interconnect channels or feedthroughs. The preforms, in turn, are adapted to be cast into a composite housing, for example, an aluminum silicon carbide (AlSiC) housing. The component preforms may include resistors, capacitors, and inductors. In addition, RF pins as well as DC pads may be cast in the housing. The electronic components are electrically coupled to an interconnect channel or feedthrough. Interconnections by way of the interconnect channels or feedthroughs within the package may be made by way of metal infusion of a metal, such as aluminum, into the ceramic of the interconnect channels. In an alternate embodiment of the invention, a polymer based integrated package, formed from a polymer, is molded around a cast base which acts as a heat sink. Interconnection between the various electronic components is made by either molding interconnect metal tracings in the polymer housing or by way of interconnection vias which are filled with polymer based conductive paste or immersion plating. In both embodiments, interconnections between electronic components forming the electronic circuit are made without the use of glass feedthroughs which greatly simplifies the cost and complexity of the package.

DESCRIPTION OF THE DRAWINGS

These and other objects of the present invention will be readily understood with reference to the following specification and attached drawing wherein.

DETAILED DESCRIPTION

Figure 1:
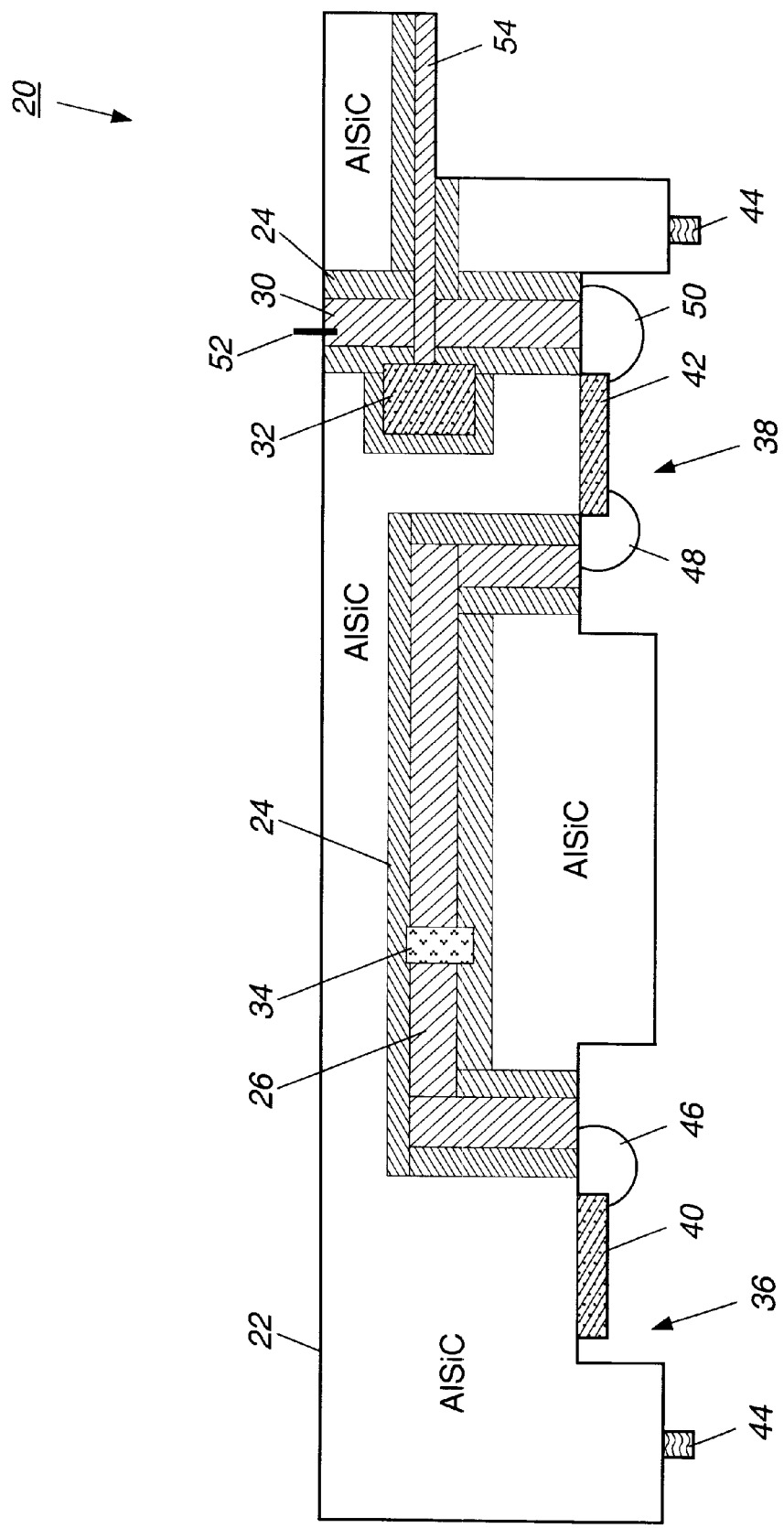
FIG. 1 is a sectional view of an exemplary electronic package in accordance with one embodiment of the invention.
Figure 2:
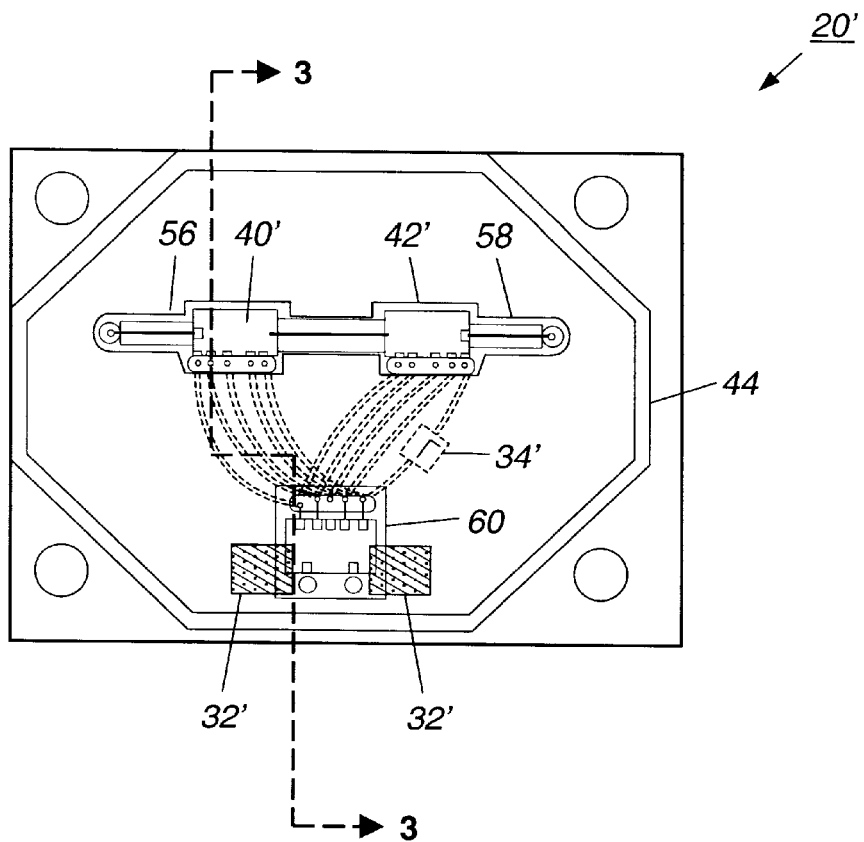
FIG. 2 is a plan view of the electronic package illustrated in FIG. 1.
Figure 3:
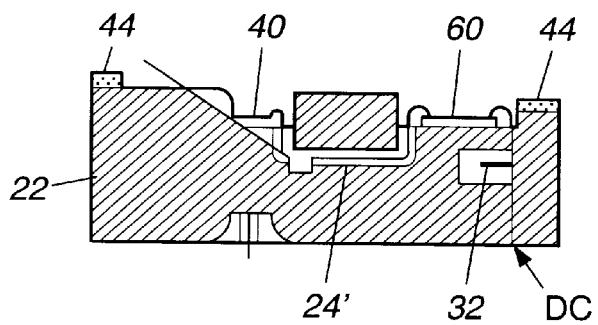
FIG. 3 is a sectional view along line 3—3 of FIG. 2.
Figure 4:
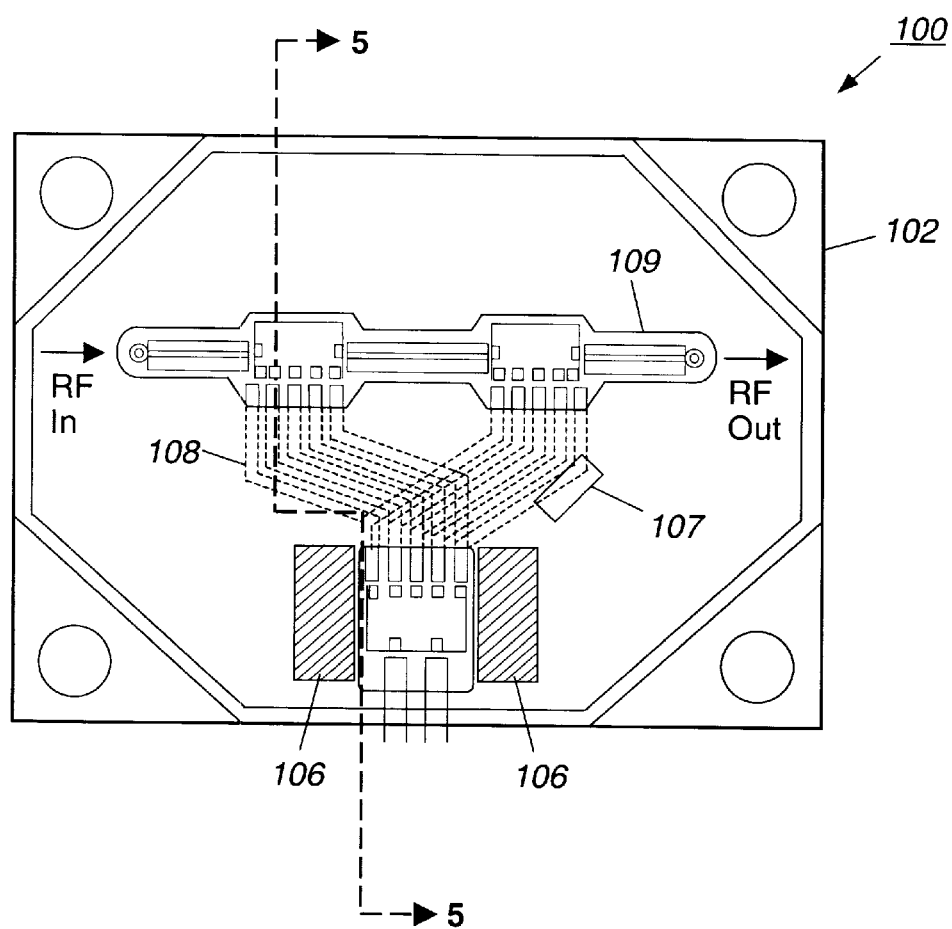
FIG. 4 is a plan view of an alternate embodiment of an electronic package in accordance with the present invention.
Figure 5:
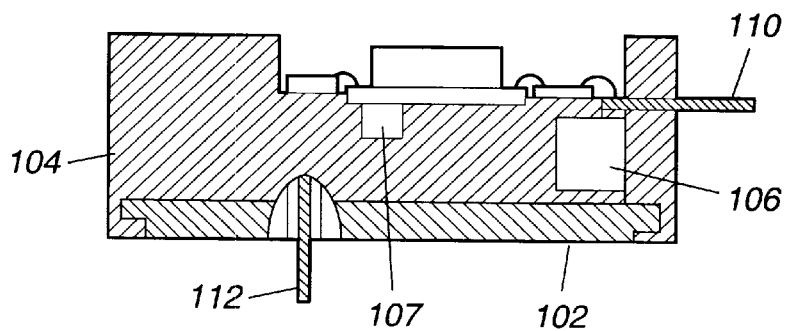
FIG. 5 is a sectional view alone line 5—5 of FIG. 4.

Two embodiments of an electronics package in accordance with the present invention are disclosed. In particular, FIGS. 1–3 illustrate a metal infusion based integrated electronic package. One configuration of the metal infusion based electronics package is illustrated in FIG. 1, while an alternate configuration is illustrated in FIGS. 2 and 3. FIGS. 4 and 5 illustrate a polymer based integrated electronics package. Both embodiments of the invention are adapted to integrate various electronic components to form a modular package for an electronics circuit, such as an RF circuit. Integration of the various components forming the electronic circuit is simplified by way of the present invention as will be discussed in more detail below to reduce the cost and complexity of the electronic packages.

Referring to the first embodiment as illustrated in FIGS. 1–3, the electronic package in accordance with the present invention is generally identified with the reference numeral 20. The electronic package 20 is formed with a composite housing 22, for example, an aluminum silicon carbide (AlSiC), configured for a particular electronic circuit application which does not form a part of the present invention. An exemplary configuration for the housing 22 is illustrated in FIGS. 1–3. Moreover, it should be understood that other composite materials can be used for housing 22.

An important aspect of the invention relates to ceramic preforms generally identified with the reference numeral 24. The ceramic preforms 24 may be cast with temperature durable electronic components, such as resistors, capacitors and inductors to form component preforms. The ceramic preforms 24 may also be configured to form interconnect channels 26 as well as feedthroughs 30. The ceramic preforms 24, in turn, are cast into the composite housing 22. Since the various electronic components, such as the coupling capacitors 32 and voltage dropping resistors 34 can be cast in the ceramic preform 24 and in turn cast into the composite housing 22, signal decoupling and signal conditioning circuitry can be disposed within the electronic package 20, relatively closely to the electronic circuit, for example an R.F. amplifier. In addition, the housing 22 may be formed with various component cavities, such as the cavities 36 and 38, for example, for receiving various non-temperature durable electronic components after the casting of the housing 22, such as integrated circuits (IC) and microwave monolithic integrated circuits (MMIC), identified with the reference numerals 40 and 42 respectively. The IC's and/or MMIC's 40 and 42 are adapted to be disposed in the cavities 36 and 38 and securely attached thereto by way of a suitable adhesive after casting of the housing 22.

Once the IC's and/or MMIC's 40 and 42 are attached, they may be interconnected to the existing interconnection channel 26 and feed through 30 using electrical conductors 46, 48 and 50. The electrical conductors 46, 48, and 50 may be gold wire, gold ribbon, or gold mesh (other metals can also be used).

An alternative process, commonly referred to as "Flip Chip," can be used, which would allow the IC and/or MMIC 40 and 42 to be gold soldered to the interconnection channel 26 and feed through 30.

In order to provide sealing of the housing, a seal ring 44 may be cast into the housing 22. The seal ring 44 is best illustrated in FIG. 2. The seal ring 44 is adapted to seal the electronic components within the electronic package 20 against a cover plate (not shown). The cover plate may be attached to the seal ring by way of a conductive adhesive, such as a low temperature seal glass in order to seal the package 20 once the electronic components have been mounted inside.

An important aspect of the invention relates to the method for making electrical interconnections between the various electronic components within the electronic package. As mentioned above, ceramic preform interconnect channels 24 as well as ceramic preformed feedthroughs 30 may be cast into the housing 22 to form a structure, for example, as illustrated in FIG. 1. After the housing 22 is cast with the required component preforms, interconnect channels 24 and feedthrough preforms, non-temperature durable electronic components, such as IC's as well as MMIC's 40 and 42, are disposed in the component cavities 36 and 38 and attached to the housing 22 by way of a suitable adhesive. Interconnections between the various components can be done in different ways. For example, as illustrated in FIG. 1, electrical connections may be made between the components 32 and 40 and the interconnect channel 26 and feedthrough 30 using one or a variety of materials placed within the channel and/or feedthrough. These connections may be made by materials such as thick film metal paste, rigid metal wire or immersion plating. After these partial connections to 32 and 34 are made, the assembly may be placed into a mold pressure/vacuum chamber and exposed to a metal, for example, aluminum, under very high pressure and vacuum. Due to the porosity of the ceramic material used for the interconnect channels 26 and feedthrough 30, the metal will infuse into the ceramic, much like water into a sponge, filling any holes or gaps with the metal to form an electrical conductor in the interconnect channel 24 or feedthrough 30. In addition, intermetallic bonds are formed with any metal (i.e. rigid metal wire, etc.) placed in the ceramic preforms 24. Thus, any components electrically coupled to the interconnect channels 26 and feedthroughs 30 will be electrically bonded by way of the metal infusion. By using the ceramic preforms, the need for glass feedthroughs is eliminated.

The various ceramic preforms, numeral 24, (i.e. component preforms, interconnect channels and feedthroughs) are molded in a green state using a tool that is the mirror image of the desired shape. The ceramic preforms are also used for forming interconnect channels in order to interconnect various components within the electronic package as well as feedthroughs. The ceramic material forms a natural insulatative barrier. By selecting the diameter of the interconnect channels as well as the type of ceramic (i.e. dielectric value) one may create a particular desired impedance. Techniques for molding ceramic materials are well known within the art. The green ceramic is then fired to bake out organic material to produce a hard and microscopically porous preform. The various ceramic preforms 24 are then cast in the housing 22. As shown in FIG. 1, RF pins 52 and DC pads can be cast in during the metal infusion process. Solder pads 54 can also be cast rather simply and easily. The solder pads 54 are normally used for input/output (I/O) attachment.

FIGS. 2 and 3 show an alternate configuration of the embodiment illustrated in FIG. 1. In this configuration, like components are identified with like reference numerals for simplification but with primes. This embodiment includes a pair of integrated circuits 40' and 42'. As illustrated in FIG. 3, the electronic package 20' may include a regulator chip 60. The circuitry may also include a pair of decoupling capacitors 32' as well as a voltage dropping resistor 34'. In this configuration., ceramic preforms 24' may be used for interconnecting various components within the electronic package 20'. As discussed above, electrical connections between various components and the ceramic preforms 24' may be made by way of thick film metal paste, rigid metal wire, or immersion plating. Interconnections within the interconnect channels 26 are by metal infusion as discussed above. Input/output connections may be made by way of a pair of microstrip substrates 56 and 58.

An alternate embodiment of the electronic package is illustrated in FIGS. 4 and 5 and generally identified with the reference numeral 100. In this embodiment, a base 102 which acts as a heat sink, is fabricated out of a suitable metal material, such as cooper. The base 102 is machined or cast to form the desired configuration, for example, as illustrated in FIG. 4. In this embodiment, a polymer 104 (FIG. 5), such as liquid crystal polymer ("LCP"), is molded around the base 102. In order to secure the polymer 104 to the base 102, the base 102 may be formed along its edges with a step shape, for example, which allows the molded polymer 104 to interlock with the base 102 as shown. Various temperature durable components, such as resistors 107, capacitors 106, inductors (not shown), and the like may be molded into the polymer 104. DC pins, such as the DC pin 110 and RF pins, such as the RF pin 112 can also be molded into the polymer 104. In addition, as shown best in FIG. 4, interconnect metal traces 108 can be insert molded into the polymer 104 to form interconnect structures. The various electronic components can either be attached to the interconnect metal traces 108 prior to molding or molded into the polymer 104 without being connected. In configurations where the electronic components are separated from the interconnect metal traces 108, the polymer 104 may be molded with interconnection holes or cavities (not shown). These interconnection cavities may be filled with polymer based conductive paste or immersion plating in order to provide interconnection between the various components within the package. A microstrip substrate 109 can also be attached, for example, by way of an adhesive, to form input/output terminals.

In order to provide isolation and hermetic sealing, the package 100 may be plated. The plating process may be initially electro-less. All exposed metal surfaces (i.e. interconnect metal traces 108) are masked so that the plating does not short the metal traces 108. The entire part may then electroplated, if required, in order to complete the interconnections. After the plating step, integrated circuits and other non-temperature durable components may be attached directly to the base 102. After assembly of the components as illustrated in FIGS. 4 and 5, a cover may be attached to the assembly using an adhesive, welding or fasteners to provide sealing protection for the components within the package.

Obviously, many modifications and variations of the present invention are possible in light of the above teachings. Thus, it is to be understood that, within the scope of the appended claims, the invention may be practiced otherwise than as specifically described above.

We claim:

1. An electronics package for housing one or more electronics components forming a circuit, the electronics package comprising:

one or more first electronic components, said first electronic components cast in ceramic forming one or more first modular ceramic preforms;

one or more interconnect channels, cast in ceramic forming second modular preforms for connecting to said one or more first electronic components in said first modular ceramic preform; and a cast housing, said cast housing cast with first and second modular ceramic preforms and formed with one or more cavities for receiving said one or more second electronic components after said housing is cast, said one or more second electronic components adapted to be interconnected with said one or more first electronic components by way of said interconnect channels in said second modular ceramic preforms.

2. The electronics package as recited in claim 1, further including third ceramic preforms, said third ceramic preforms configured as feedthroughs and cast in said housing with said first ceramic preforms.

3. The electronics package as recited in claim 1, wherein interconnections between said electronic components is at least partially by metal infusion in said interconnect channels.

4. The electronics package as recited in claim 3, further including a pin cast into said housing.

5. The electronics package as recited in claim 4, wherein said pin is a DC pin.

6. The electronics package as recited in claim 4, wherein said pin is an RF pin.

7. The electronics package as recited in claim 1, wherein said cast housing is formed from a composite material.

8. The electronics package as recited in claim 7, wherein said composite material is aluminum silicon carbide (AlSiC).

9. The electronics package as recited in claim 1, further including a seal ring for enabling said package to be sealed.

10. The electronics package as recited in claim 1, wherein said housing is formed with cavities for receiving one or more electronics components after said housing is cast.

11. The electronics package as recited in claim 1, wherein said first electronic components include resistors.

12. The electronics package as recited in claim 1, wherein said first electronic components include capacitors.

13. The electronics package as recited in claim 1, wherein said first electronic components include inductors.

* * * * *